United States Patent
Koyama et al.

(10) Patent No.: US 10,720,914 B1
(45) Date of Patent: Jul. 21, 2020

(54) SEMICONDUCTOR DEVICE AND SEMICONDUCTOR PACKAGE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Masahiro Koyama, Shinagawa (JP); Kentaro Ikeda, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/563,677

(22) Filed: Sep. 6, 2019

(30) Foreign Application Priority Data

Jan. 4, 2019 (JP) ................................. 2019-000280

(51) Int. Cl.
*H01L 27/06* (2006.01)
*H03K 17/081* (2006.01)
*H03K 17/0814* (2006.01)

(52) U.S. Cl.
CPC ............................. *H03K 17/08142* (2013.01)

(58) Field of Classification Search
CPC ....... H01L 27/12; H01L 27/124; H01L 27/04; H01L 29/78; H01L 29/861; H01L 25/50; H01L 25/16
USPC ........ 327/108–112, 379–384; 326/82, 83, 87
See application file for complete search history.

(56) References Cited

U.S. PATENT DOCUMENTS

| 6,847,174 B2* | 1/2005 | Franck .................... H02M 1/38 |
| | | 315/209 R |
| 9,142,544 B2 | 9/2015 | Ikeda |
| 9,762,232 B2 | 9/2017 | Yonezawa et al. |
| 10,084,442 B2 | 9/2018 | Ikeda et al. |
| 2014/0284662 A1* | 9/2014 | Ikeda .................. H01L 27/0255 |
| | | 257/195 |

(Continued)

FOREIGN PATENT DOCUMENTS

| JP | 2015-128218 A | 7/2015 |
| JP | 5996465 B2 | 9/2016 |

(Continued)

*Primary Examiner* — Tomi Skibinski
(74) *Attorney, Agent, or Firm* — Oblon, McClelland, Maier & Neustadt, L.L.P.

(57) ABSTRACT

A semiconductor device has a normally-off transistor which comprises a first source, a first drain, and a first gate, a normally-on transistor which comprises a second source connected electrically to the first drain, a second drain, and a second gate, a gate drive circuit which drives the first gate and the second gate, a first resistor which is connected between an output node of the gate drive circuit and the first gate, a second resistor and a first capacitor which are connected in series between the output node and the second gate, a first rectifier element which comprises a first anode and a first cathode, a second rectifier element which comprises a second anode and a second cathode, a first inductor, a second inductor, and a second capacitor and a third inductor which are connected in series between the first source and the second source.

14 Claims, 9 Drawing Sheets

(56) References Cited

U.S. PATENT DOCUMENTS

| | | | |
|---|---|---|---|
| 2015/0270255 A1* | 9/2015 | Ikeda | H01L 27/0255 257/77 |
| 2016/0218099 A1* | 7/2016 | Ikeda | H02M 3/155 |
| 2016/0218100 A1* | 7/2016 | Ikeda | H01L 27/0629 |
| 2018/0013415 A1* | 1/2018 | Ikeda | H03K 17/74 |
| 2018/0019686 A1* | 1/2018 | Ikeda | H01L 27/0629 |
| 2018/0174986 A1 | 6/2018 | Tamura et al. | |
| 2019/0296008 A1* | 9/2019 | Ikeda | H01L 23/5286 |

FOREIGN PATENT DOCUMENTS

| | | |
|---|---|---|
| JP | 6392458 B2 | 9/2018 |
| WO | WO 2017/010554 A1 | 1/2017 |
| WO | WO 2017/043611 A1 | 3/2017 |

\* cited by examiner

SEMICONDUCTOR DEVICE AND SEMICONDUCTOR PACKAGE

CROSS REFERENCE TO RELATED APPLICATIONS

This application is based upon and claims the benefit of priority from the prior Japanese Patent Application No. 2019-280, filed on Jan. 4, 2019, the entire contents of which are incorporated herein by reference.

FIELD

Embodiments of the present disclosure relate to a semiconductor device.

BACKGROUND

A group III nitride, for example, a gallium nitride (GaN)-based semiconductor is expected as a material for a next-generation power semiconductor device. The GaN-based semiconductor has a band gap wider than that of a silicon (Si) semiconductor. For this reason, in the GaN-based semiconductor device, the power semiconductor device can be made smaller in size and higher in breakdown voltage compared to the Si semiconductor device. Accordingly, a parasitic capacitance can be reduced, and thus a high-speed driven power semiconductor device can be realized.

In a GaN-based transistor, generally, a high electron mobility transistor (HEMT) structure which uses a two-dimensional electron gas (2DEG) as a carrier is applied. A normal HEMT is a normally-on transistor which is conducted even when a voltage is not applied to a gate.

In a power supply circuit or the like which handles a large amount of electric power of several hundreds V to one thousand V, a normally-off operation is required with emphasis on safety. In this regard, a circuit configuration is proposed in which the normally-on GaN-based transistor and the normally-off Si transistor are cascode-connected to realize the normally-off operation.

In the case of a circuit configuration in which a main circuit current flowing between a drain and a source and a drive current flowing between a gate and a source share a source inductance, the drive current is modulated due to the influence of an electromotive force which is generated in the source inductance according to the time change of the main circuit current. Accordingly, there occurs a problem of a delay that a rising speed or a falling speed of the power semiconductor device is slowed down or a ringing that a drain current or a source voltage is sharply changed with time. In this regard, a circuit configuration with Kelvin connection is proposed in which the main circuit current and the gate drive current do not share the source inductance.

However, even in the circuit configuration using Kelvin connection, the problem that the drive current is modulated due to the influence of the main circuit current cannot be resolved completely, and the problem that the rising speed or the falling speed of the normally-on transistor is slowed down still occurs. The decrease of the rising speed or the falling speed of the normally-on transistor may cause the increase of the switching loss. Thus, proper measures are required.

DETAILED DESCRIPTION

According to one embodiment, a semiconductor device has:

a normally-off transistor which comprises a first source, a first drain, and a first gate;

a normally-on transistor which comprises a second source connected electrically to the first drain, a second drain, and a second gate;

a gate drive circuit which drives the first gate and the second gate;

a first resistor which is connected between an output node of the gate drive circuit and the first gate;

a second resistor and a first capacitor which are connected in series between the output node and the second gate;

a first rectifier element which comprises a first anode connected electrically to the second gate and a first cathode connected electrically to the first source or the first drain;

a second rectifier element which comprises a second anode connected electrically to the gate drive circuit and a second cathode connected electrically to the first gate;

a first inductor which is connected between the first drain and the second source;

a second inductor which is connected electrically between a reference potential node of the gate drive circuit and the first source; and a second capacitor and a third inductor which are connected in series between the first source and the second source.

Hereinafter, embodiments of the present disclosure will be described with reference to the drawings. In the following embodiments, the description will be given mainly about characteristic configurations and operations in the semiconductor device. However, the semiconductor device may include configurations and operations omitted in the descriptions below.

The semiconductor device in the present specification is a concept including a power module in which a plurality of semiconductor elements such as a discrete semiconductor are combined, an intelligent power module in which a drive circuit of driving these elements or a self-protection function is incorporated in a plurality of elements such as a discrete semiconductor, or the entire system including the power module and the intelligent power module.

In the present specification, the term "GaN-based semiconductor" is a generic term for a group III-IV semiconductor which includes gallium nitride (GaN), aluminum nitride (AlN), indium nitride (InN), and an intermediate composition thereof.

Figure 1:
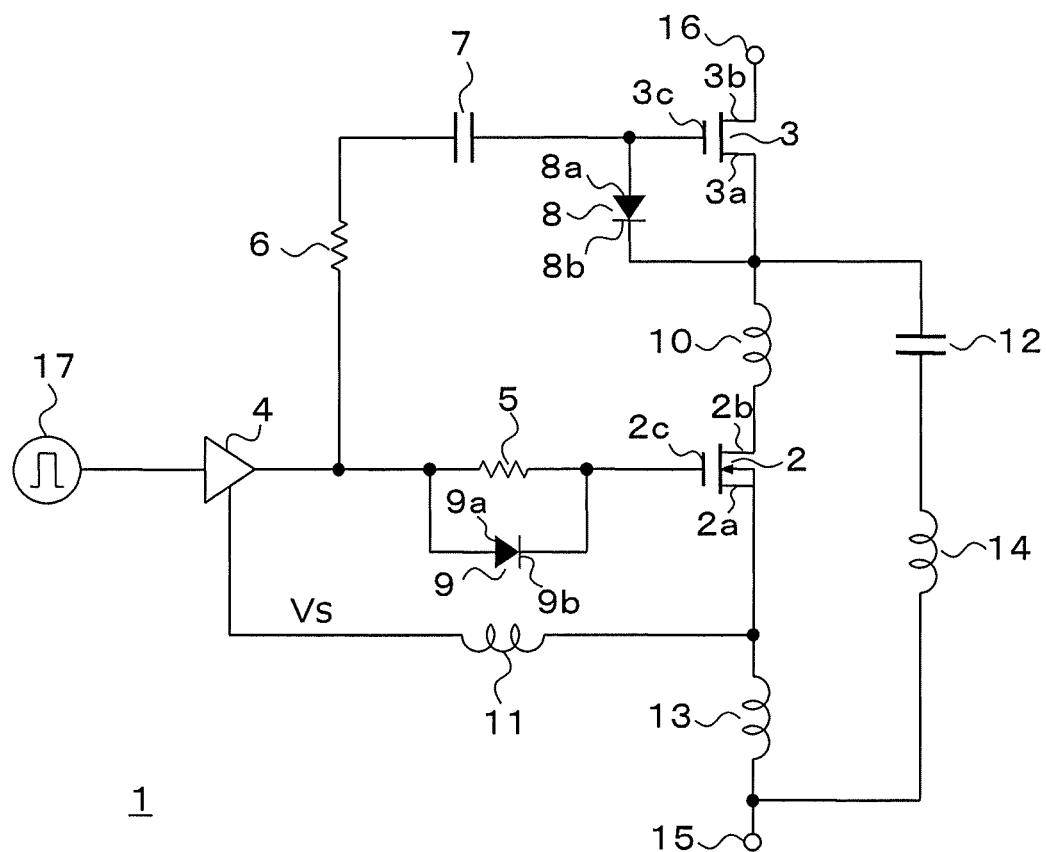
FIG. 1 is a circuit diagram of a semiconductor device according to one embodiment.

FIG. 1 is a circuit diagram of a semiconductor device 1 according to one embodiment. In the semiconductor device 1 of FIG. 1, for example, at least partial configuration of the power module having a rated voltage of 600 V to 1200 V is illustrated. The semiconductor device 1 of FIG. 1 includes a normally-off transistor 2, a normally-on transistor 3, a gate drive circuit 4, a first resistor 5, a second resistor 6, a first capacitor 7, a first rectifier element 8, a second rectifier element 9, a first inductor 10, a second inductor 11, a second capacitor 12, and a third inductor 13.

The normally-off transistor 2 includes a first source 2a, a first drain 2b, and a first gate 2c. The normally-off transistor 2 is a transistor in which a drain current does not flow in a case where a voltage is not applied to the first gate 2c. For example, the normally-off transistor 2 is a vertical metal oxide semiconductor field effect transistor (MOSFET) which uses a silicon (Si) semiconductor. Incidentally, the normally-off transistor 2 includes a parasitic body diode (not illustrated). The breakdown voltage of the normally-off transistor 2 is 10 V to 30 V or less, for example.

The normally-on transistor 3 includes a second source 3a, a second drain 3b, and a second gate 3c which are electrically connected to the first drain 2b of the normally-off transistor 2. The normally-on transistor 3 is a transistor in which a drain current flows even in a case where a voltage is not applied to a gate. For example, the normally-on transistor 3 is a HEMT which uses a GaN-based semiconductor. The breakdown voltage of the normally-on transistor 3 is higher than the breakdown voltage of the normally-off transistor 2. For example, the breakdown voltage of the normally-on transistor 3 is 600 V to 1200 V. Both the normally-off transistor 2 and the normally-on transistor 3 are N type.

When the normally-off transistor 2 and the normally-on transistor 3 are cascode-connected, the semiconductor device 1 of FIG. 1 realizes a normally-off operation. Herein, the cascode connection means that the first source 2a of the normally-off transistor 2 and the second drain 3b of the normally-on transistor 3 are connected electrically. In actual, a parasitic inductance is generated when the first source 2a and the second drain 3b are connected by a bonding wire 50 or the like. In the present specification, the parasitic inductance which is present between the first source 2a and the second drain 3b is called the first inductor 10.

The gate drive circuit 4 drives the first gate 2c of the normally-off transistor 2 and the second gate 3c of the normally-on transistor 3. More specifically, the gate drive circuit 4 outputs a signal for driving the first gate 2c and the second gate 3c on the basis of the signal output from a signal source 17. For example, the signal source 17 outputs a signal such as a square wave.

The gate drive circuit 4 may be an IC in which a plurality of semiconductor elements in the gate drive circuit 4 are formed on the same semiconductor substrate to be packaged or an electronic circuit substrate in which a plurality of semiconductor elements in the gate drive circuit 4 are mounted. The gate drive circuit 4 has a reference potential node Vs. For example, the reference potential node Vs is electrically connected to a grounding node of 0 V.

Incidentally, in the present specification, an input/output part of an optional semiconductor element is called a node. The node may be a terminal or a connection place such as a contact or the bonding wire 50 where an electrical connection to another semiconductor element is performed.

The first resistor 5 is connected between the output node of the gate drive circuit 4 and the first gate 2c. The first resistor 5 is a gate resistor of the normally-off transistor 2.

The output node of the gate drive circuit 4 means a node which outputs a signal for driving the first gate 2c and the second gate 3c.

The second resistor 6 and the first capacitor 7 are connected in series between the output node of the gate drive circuit 4 and the second gate 3c. The second resistor 6 is a gate resistor of the normally-on transistor 3. The first resistor 5 and the second resistor 6 may include a parasitic resistor of the bonding wire 50 or a wiring pattern.

The first rectifier element 8 includes a first anode 8a electrically connected to the second gate 3c and a first cathode 8b electrically connected to the first source 2a or the first drain 2b. The first rectifier element 8 may be a diode or a diode-connected transistor. FIG. 1 illustrates an example in which the first cathode 8b of the first rectifier element 8 is connected to the first drain 2b.

The second rectifier element 9 includes a second anode 9a electrically connected to the output node of the gate drive circuit 4 and a second cathode 9b electrically connected to the first gate 2c. The second rectifier element 9 may be a diode or a diode-connected transistor. The second rectifier element 9 is connected in parallel with the first resistor 5.

The first inductor 10 is connected between the first drain 2b and the second source 3a. As described above, the first inductor 10 may include a parasitic inductance of the bonding wire 50, the wiring pattern, or the like.

The second inductor 11 is electrically connected between the reference potential node Vs of the gate drive circuit 4 and the first source 2a. The second inductor 11 may include the parasitic inductance of the bonding wire 50 connected to the reference potential node Vs of the gate drive circuit 4 or the wiring pattern.

The second capacitor 12 and the third inductor 13 are connected in series between the first source 2a and the second source 3a. More specifically, the second capacitor 12 is connected between one end part of the third inductor 13 and the second source 3a. The second inductor 11 is connected to the connection node of the other end part of the third inductor 13 and the reference potential node Vs of the gate drive circuit 4. The third inductor 13 may include the parasitic inductance of the bonding wire 50 connected to the first source 2a of the normally-off transistor 2 or the wiring pattern. The second capacitor 12 desirably has a capacitance equal to or more than that of the first capacitor 7.

The semiconductor device 1 of FIG. 1 may include a fourth inductor 14. The fourth inductor 14 is connected between the other end part of the second capacitor 12 and one end part of the third inductor 13.

Furthermore, the semiconductor device 1 of FIG. 1 may include a third capacitor (not illustrated) connected between the second gate 3c of the normally-on transistor 3 and the first drain 2b of the normally-off transistor 2. The third capacitor may include a parasitic capacity.

The semiconductor device 1 of FIG. 1 includes a source terminal 15 and a drain terminal 16. The source terminal 15 is electrically connected to one end part of the third inductor 13. The source terminal 15 may be connected to the reference potential node such as a grounding node or connected to various semiconductor elements. For example, in a case where a plurality of the semiconductor devices 1 of FIG. 1 is cascaded, the source terminal 15 is connected to the second drain 3b in another semiconductor device 1. The drain terminal 16 is connected to the drain of the normally-on transistor 3. The drain terminal 16 may be connected to a power supply voltage node or connected to various semiconductor elements.

Next, the operation of the semiconductor device 1 according to the present embodiment will be described. For example, the gate drive circuit 4 outputs a square-wave signal of alternately repeating 0 V and a voltage Va which can allow the normally-off transistor 2 to be turned on. When the voltage Va is input to the first gate 2c, the normally-off transistor 2 is turned on, and when the voltage 0 V is input to the first gate 2c, the normally-off transistor 2 is turned off.

When the gate drive circuit 4 outputs the voltage Va, the voltage of one end part of the first capacitor 7 increases, and a current flows to the source terminal 15 through the first rectifier element 8. The voltage according to the forward voltage VF of the first rectifier element 8 is input to the second gate 3c. Therefore, the normally-on transistor 3 is turned on.

When the output signal of the gate drive circuit 4 is changed from Va to 0 V, the voltage of the second gate 3c connected to the first capacitor 7 decreases from VF by Va to be a negative voltage (VF−Va). Therefore, the normally-on transistor 3 is turned off.

Herein, when the semiconductor device 1 according to the present embodiment transits from off to on, the normally-off transistor 2 is desirably turned on prior to the normally-on transistor 3. This is because there is a concern that if the normally-on transistor 3 is turned on previously, a high voltage is applied to a connection part between the first drain 2b and the second source 3a, and the property of the normally-off transistor 2 having a low breakdown voltage is deteriorated. In the semiconductor device 1 of the present embodiment, when the semiconductor device 1 transits from the OFF state to the ON state, a current flows through the second rectifier element 9 provided in parallel with the first resistor 5. For this reason, the charging of the first gate 2c is not affected by the first resistor 5. Accordingly, it is possible to quickly charge the first gate 2c. Thus, when the semiconductor device 1 transits from the OFF state to the ON state, the normally-off transistor 2 can be reliably turned on prior to the normally-on transistor 3, and there is no concern that a high voltage exceeding the breakdown voltage is applied to the first drain 2b of the normally-off transistor 2.

When the first resistor 5 and the second resistor 6 are provided, the off timing of the normally-off transistor 2 and the off timing of the normally-on transistor 3 can be delayed by a desirable time. Accordingly, when the semiconductor device 1 transits from the ON state to the OFF state, the normally-on transistor 3 can be turned off prior to the normally-off transistor 2.

Figure 2:
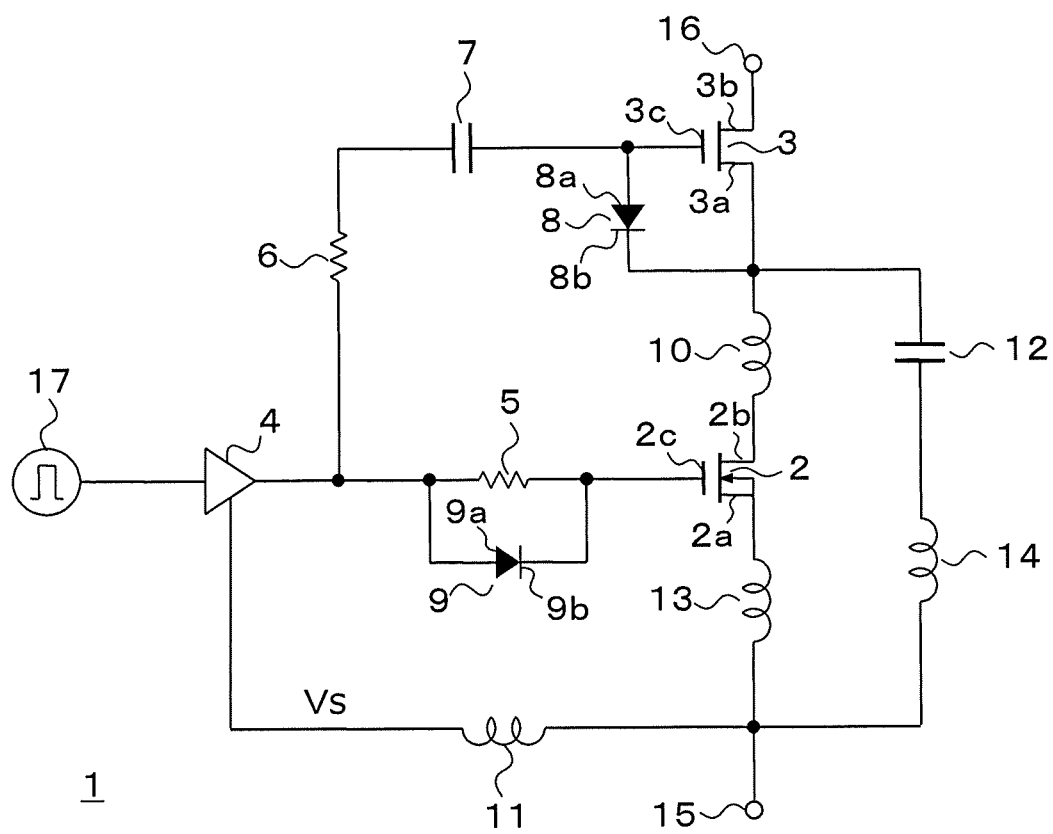
FIG. 2 is a circuit diagram of a semiconductor device according to one comparative example.

FIG. 2 is a circuit diagram of the semiconductor device 1 according to one comparative example. In the semiconductor device 1 of FIG. 2, the connection place of one end part of the second inductor 11 is different from that of the semiconductor device 1 of FIG. 1. More specifically, one end part of the second inductor 11 of FIG. 2 is electrically connected to the connection node of the third inductor 13 and the fourth inductor 14. On the other hand, in the semiconductor device 1 of FIG. 1, one end part of the second inductor 11 is electrically connected to the first source 2a of the normally-on transistor 3.

Figure 3:
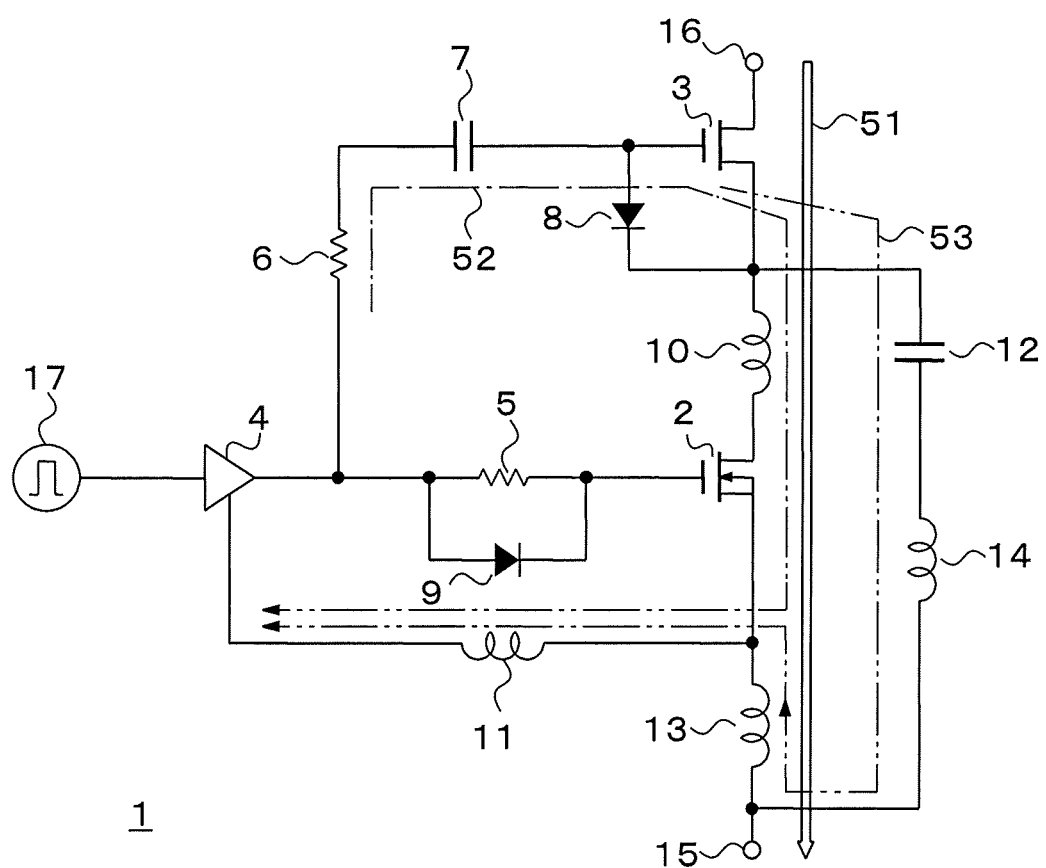
FIG. 3 is a view illustrating a current path of the semiconductor device of FIG. 1.
Figure 4:
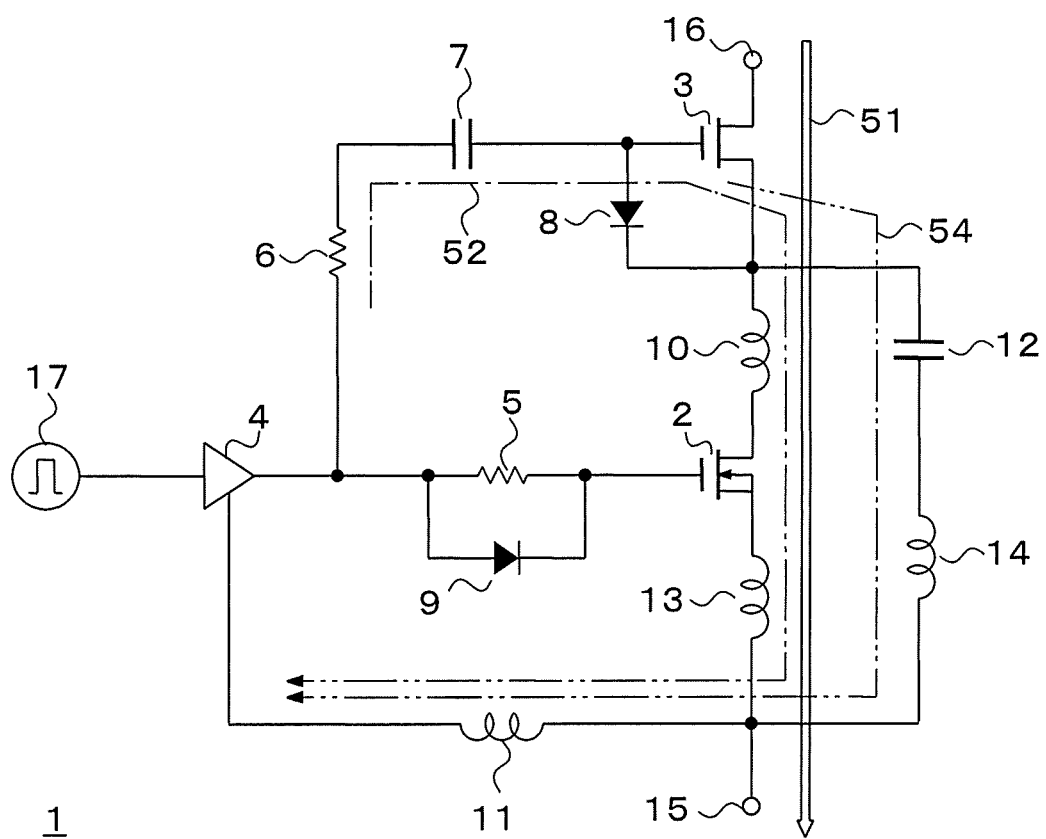
FIG. 4 is a view illustrating a current path of the semiconductor device of FIG. 2.

FIG. 3 is a view illustrating the current path of the semiconductor device 1 of FIG. 1, and FIG. 4 is a view illustrating the current path of the semiconductor device 1 of FIG. 2. In both of the semiconductor devices 1 of FIGS. 1 and 2, at the time of the ON state, a current flows to the source terminal 15 through between the first drain 2b and the first source 2a of the normally-on transistor 3 and between the second drain 3b and the second source 3a of the normally-off transistor 2. The current path is a main circuit current path.

In both of the semiconductor devices 1 of FIGS. 3 and 4, a first current path 52 through which a current flows along the main circuit current path 51 and another current path bypassing from the first current path 52 are included in addition to the main circuit current path 51. The current path is called a second current path 53 in the semiconductor device 1 of FIG. 1 and is called a third current path 54 in the semiconductor device 1 of FIG. 4. The path through which a current flows is partially different between the second current path 53 and the third current path 54.

Both of the second current path 53 and the third current path 54 are common in that the both current paths are a path from the second source 3a of the normally-on transistor 3 to the second capacitor 12→the fourth inductor 14→the third inductor 13→the reference potential node Vs of the gate drive circuit 4. Accordingly, it is possible to bypass the source inductance of the normally-on transistor 3 to form Kelvin connection. When the current path is provided as above, the delay time taken when the normally-on transistor 3 transits from on to off and from off to on can be shortened, and the ringing of the current flowing through the second gate 3c of the normally-on transistor 3 can be suppressed.

Compared to the semiconductor device 1 of FIG. 2, the semiconductor device 1 of FIG. 1 is characterized in that the delay time during the transition of the normally-on transistor 3 can be shortened further to reduce the switching loss.

More specifically, as illustrated in the arrows of FIGS. 3 and 4, the first current path 52 in the semiconductor devices 1 of FIGS. 1 and 2 is a current path passing through the second resistor 6→the second gate 3c of the normally-on transistor 3→the parasitic capacity (third capacitor) in the second source 3a→the first drain 2b-the first source 2a of the normally-off transistor 2→the second inductor 11 in order.

Additionally, the semiconductor device 1 of FIG. 1 includes the second current path 53. The second current path 53 is a current path passing through the second source 3a of the normally-on transistor 3→the second capacitor 12→the fourth inductor 14→the third inductor 13→the second inductor 11 in order.

In this way, in the semiconductor device 1 of FIG. 1, the direction of the current flowing through the third inductor 13 is reverse in the main circuit current path 51 and the second current path 53. Accordingly, the drive current flowing through the second gate 3c of the normally-on transistor 3 is hardly affected by the change of the current flowing through the first current path 52, and a transition rate of the current and the voltage flowing through the second gate 3c of the normally-on transistor 3 can be improved. The reason that the second source 3a of the normally-on transistor 3 is Kelvin-connected is to prevent that the drive current is modulated by the electromotive force generated in the source inductance according to the time change of the current flowing through the main circuit current path 51 (first current path 52). As illustrated in FIG. 3, in the semiconductor device 1 of FIG. 1, the direction of the current flowing through the third inductor 13 is reverse in the main circuit current path 51 and the second current path 53. Thus, it is possible to suppress the electromotive force generated in the source inductance, and as a result, to increase a transition rate when the second gate 3c of the normally-on transistor 3 transits from off to on or from on to off. When the transition rate of the normally-on transistor 3 is increased, the switching loss can be also reduced.

On the other hand, the semiconductor device 1 of FIG. 2 includes the third current path 54 as illustrated in FIG. 4. The third current path 54 is a current path passing through the second source 3a of the normally-on transistor 3→the second capacitor 12→the fourth inductor 14→the second inductor 11 in order.

In the third current path 54 in the semiconductor device 1 of FIG. 2, a current does not flow through the third inductor 13. Thus, in the third inductor 13, a current flows only in the direction of the current of the main circuit current path 51 and the first current path 52. Thus, the transition rate when the normally-on transistor 3 transits from off to on decreases compared to the semiconductor device 1 of FIG. 1.

Figure 5A:
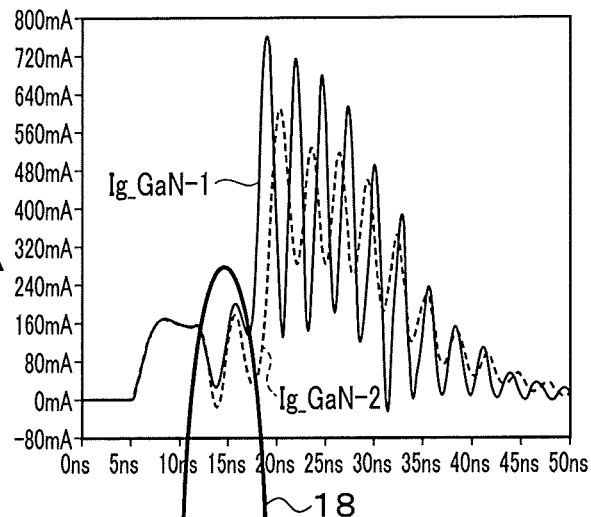
FIGS. 5A, 5B, and 5C are views in which a gate voltage waveform and a gate current waveform of the semiconductor device are compared between FIGS. 1 and 2.
Figure 5B:
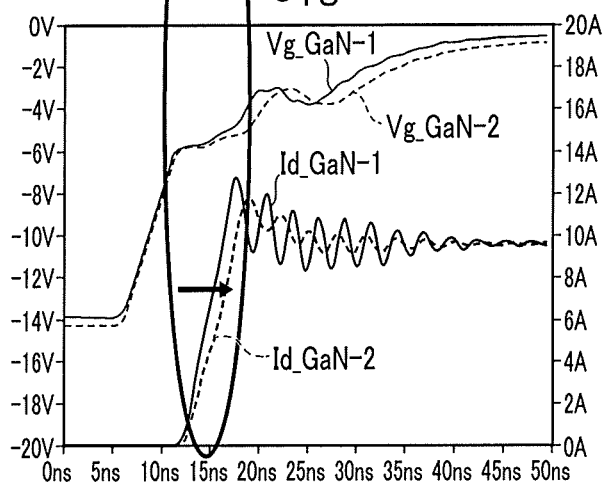
Figure 5C:
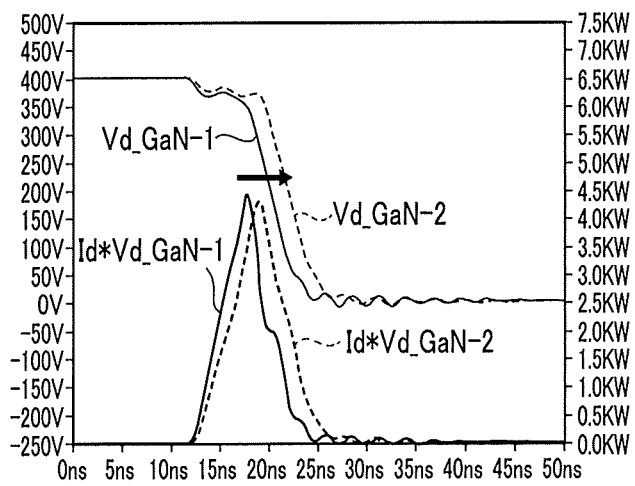

FIG. 5A is a view in which the gate current waveform when the normally-on transistor 3 transits from off to on is compared between the semiconductor devices 1 of FIGS. 1 and 2. In FIG. 5A, a horizontal axis is time, and a vertical axis is a current value. In FIGS. 5A to 5C, the gate current waveform of the semiconductor device of FIG. 1 is indicated by a solid line, and the gate current waveform of the semiconductor device of FIG. 2 is indicated by a broken line.

FIG. 5B is a view obtained by enlarging a partial time area of FIG. 5A. As understood from the waveform of the gate current and the gate voltage in the frame of FIG. 5B, in the semiconductor device 1 of FIG. 1, the transition rate is improved clearly compared to the semiconductor device 1 of FIG. 2. In addition, the ringing of the gate current in the frame 18 is also suppressed compared to one comparative example.

FIG. 5C is a view in which the gate current waveform when the normally-on transistor 3 transits from on to off is compared, and the gate voltage waveform is compared between the semiconductor devices 1 of FIGS. 1 and 2. In a case where the normally-on transistor 3 transits from on to off, in the semiconductor device 1 of FIG. 1, the waveform of the gate current and the gate voltage is changed more steeply than that in the semiconductor device 1 of FIG. 2, thus the transition rate is improved.

Figure 6A:
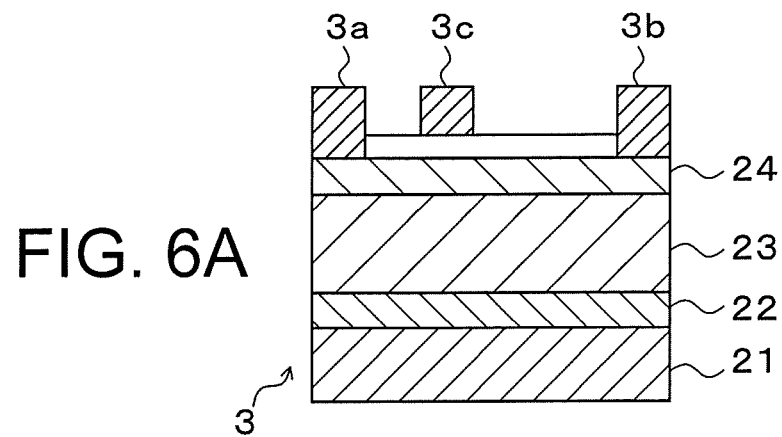
FIGS. 6A, 6B, and 6C are sectional views of a normally-on transistor, a normally-off transistor, and first and second rectifier elements.

FIG. 6A is a schematic sectional view of the normally-on transistor 3. The normally-on transistor 3 of FIG. 6A has a structure in which a buffer layer 22, a GaN layer 23, and an AlGaN layer 24 are laminated in order on a Si substrate 21. The normally-on transistor 3 of FIG. 6A is an example of a lateral transistor in which channels are formed substantially parallel to a lamination surface, and the second gate 3c, the second drain 3b, and the second source 3a are arranged on the upper side of the AlGaN layer 24. Incidentally, the normally-on transistor 3 according to the present embodiment may be a vertical transistor in which the second drain 3b is provided on the opposite side to the second gate 3c and the second source 3a.

Figure 6B:
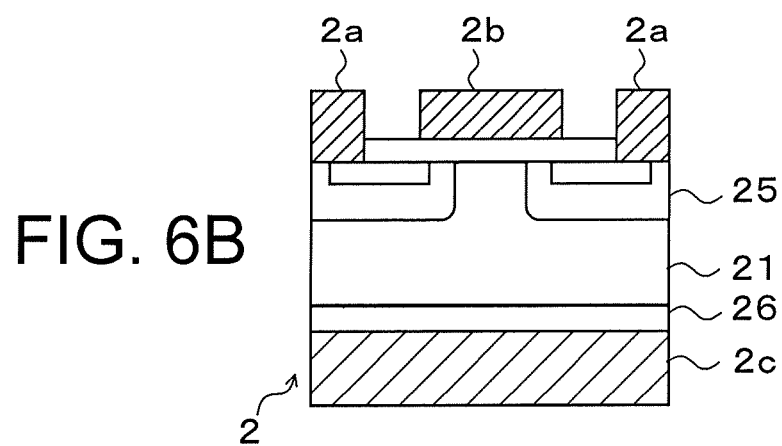

FIG. 6B is a schematic sectional view of the normally-off transistor 2. In the normally-off transistor 2 of FIG. 6B, a source diffusion region 25 is formed on the Si substrate 21. The first source 2a and the first gate 2b are arranged on the source diffusion region 25, and the first drain 2c is arranged through a drain diffusion region 26 on the opposite surface side.

Figure 6C:
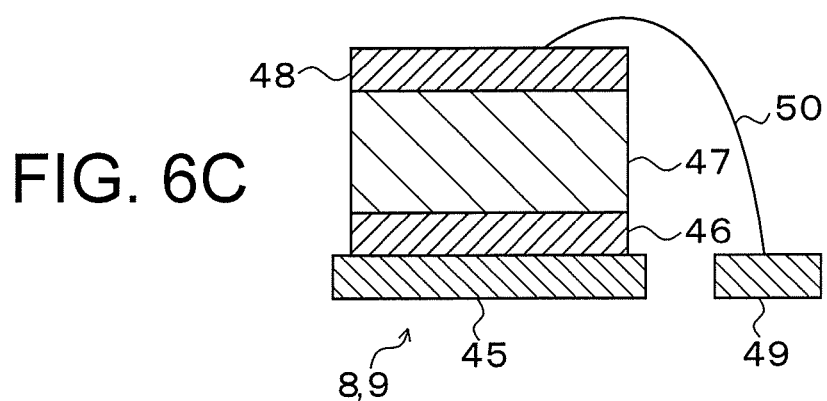

FIG. 6C is a schematic sectional view of the first and second rectifier elements 8 and 9. FIG. 6C illustrates an example in which the first and second rectifier elements 8 and 9 are formed in a vertical structure. An anode region 46 is arranged on an anode electrode 45, and a cathode region 48 is arranged through a pn junction layer 47 on the anode region 46. The cathode region 48 and a cathode electrode 49 are connected electrically by the bonding wire 50.

Figure 7:
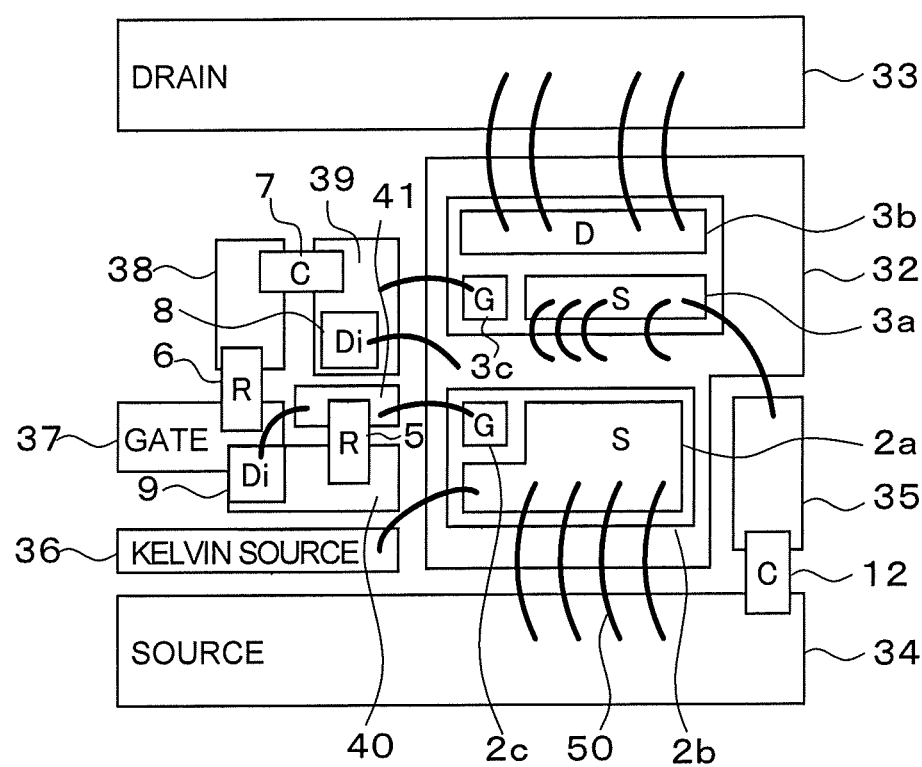
FIG. 7 is a schematic layout diagram of the semiconductor device according to the present embodiment.

FIG. 7 is a schematic layout diagram of the semiconductor device 1 according to the present embodiment. A first drain region 32 for the first drain 2b, a second drain region 33 electrically connected to the drain terminal 16, a first source region 34 electrically connected to the source terminal 15, a second source region 35 for the second source 3a, a Kelvin source region 36, and first to fifth wiring pattern regions 37 to 41 are arranged on a base substrate.

The normally-on transistor 3 having the cross-sectional structure of FIG. 6A and the normally-off transistor 2 having the cross-sectional structure of FIG. 6B are arranged on the first drain region 32. The normally-off transistor 2 is arranged such that the first drain 2b comes into contact with the first drain region 32. The second capacitor 12 is arranged to come into contact with the second source region 35 and the first source region 34.

In FIG. 7, an output node of a gate driver (not illustrated) is connected electrically to the first wiring pattern region 37. The second resistor 6 is arranged to come into contact with the first wiring pattern region 37 and the second wiring pattern region 38. The first capacitor 7 is arranged to come into contact with the second wiring pattern region 38 and the third wiring pattern region 39.

The anode surface of the first rectifier element 8 is in contact on the third wiring pattern region 39. The cathode 8b of the first rectifier element 8 is connected to the first drain region 32 through the bonding wire 50. The Kelvin source region 36 is connected to the first source 2a of the normally-off transistor 2 through the bonding wire 50.

The second rectifier element 9 is arranged to come into contact with the first wiring pattern region 37 and the fourth wiring pattern region 40. The anode surface of the second rectifier element 9 is in contact on the first wiring pattern region 37 and the fourth wiring pattern region 40. The cathode 9b of the second rectifier element 9 is connected to the fifth wiring pattern region 41 through the bonding wire 50. The first resistor 5 is arranged to come into contact with the fourth wiring pattern region 40 and the fifth wiring pattern region 41, and the second rectifier element 9 is arranged in parallel with the first resistor 5.

A characteristic configuration in the layout diagram of FIG. 7 is that the direction of the current flowing on the first current path 52 (main circuit current path 51) and the direction of the current flowing on the second current path 53 are different in the bonding wire 50 which connects the first source 2a of the normally-off transistor 2 and the first source region 34. When the direction of the current flowing through the bonding wire 50 is reverse in the first current path 52 and the second current path 53, the transition rate during the transition from off to on and from on to off of the semiconductor device of FIG. 1 can increase.

The semiconductor device 1 of FIG. 1 is an example in which the cathode 8b of the first rectifier element 8 in which the anode 8a is connected to the second gate 3c of the normally-on transistor 3 is connected electrically to the second source 3a of the normally-on transistor 3. However, as illustrated in a circuit diagram of a semiconductor device according to one modification of FIG. 8, the cathode 8b of the first rectifier element 8 may be connected electrically to the first source 2a of the normally-off transistor 2.

Figure 8:
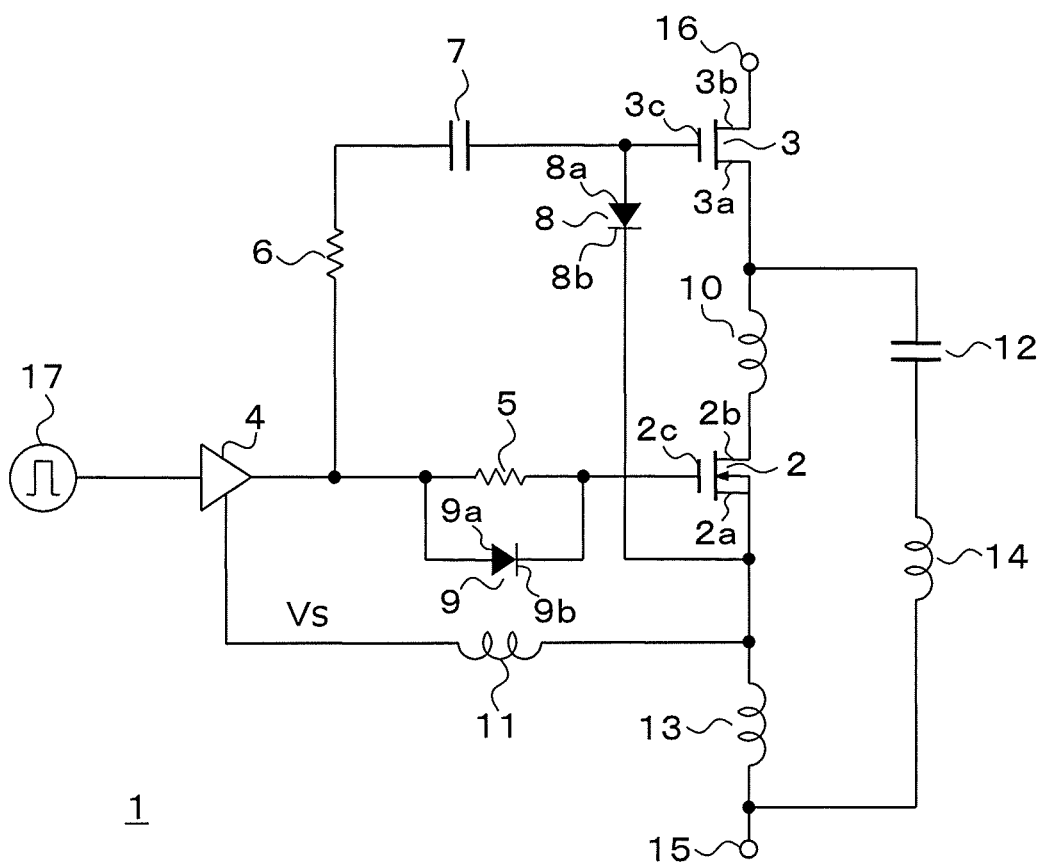
FIG. 8 is a circuit diagram of a semiconductor device according to one modification.
Figure 9:
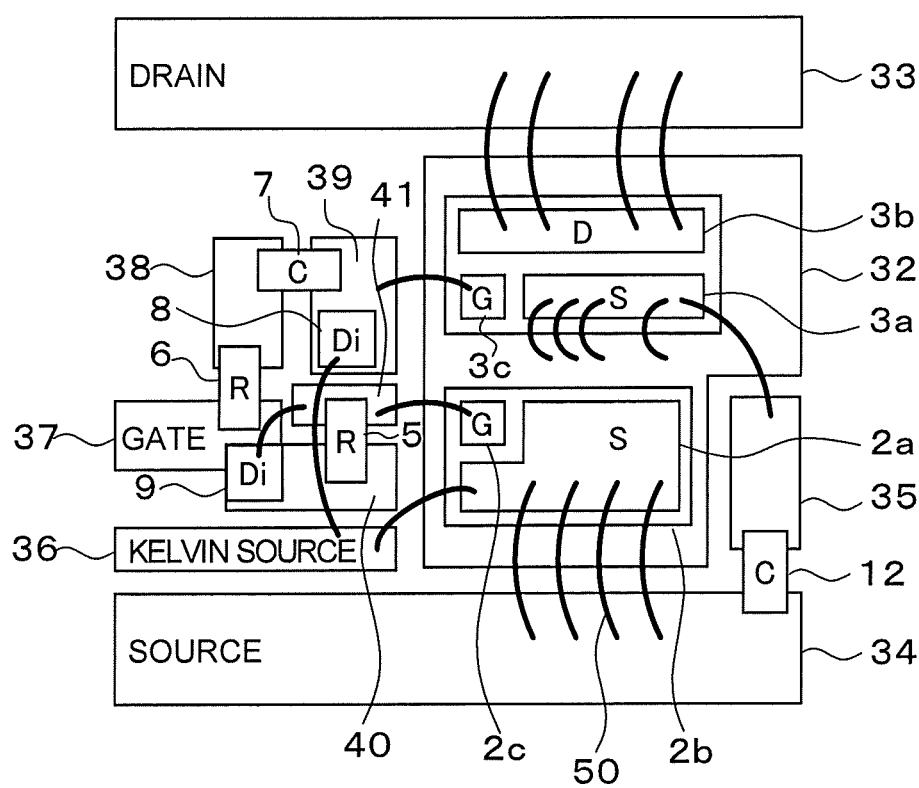
FIG. 9 is a schematic layout diagram of the semiconductor device of FIG. 8.

For example, a layout diagram corresponding to the semiconductor device 1 of FIG. 8 is illustrated as in FIG. 9. In FIG. 9, the cathode of the first rectifier element 8 is connected to the Kelvin source region 36 through the bonding wire 50.

Even in the layout diagram of FIG. 9, similarly with FIG. 7, the direction of the current flowing on the main circuit current path 51 and the direction of the current flowing on the second current path 53 are different in the bonding wire 50 which connects the first source 2a of the normally-off transistor 2 and the first source region 34, and the transition rate is obtained similarly with the layout diagram of FIG. 7.

In this way, in the present embodiment, in the semiconductor device 1 in which the normally-on transistor 3 and the normally-off transistor 2 are cascode-connected, the first current path 52 and the second current path 53 are provided in addition to the main circuit current path 51, and the direction in which the current passing through the main circuit current path 51 passes through the third inductor 13 and the current direction in which the current passing through the second current path 53 passes through the third inductor 13 are reverse to each other. Thus, it is possible to increase the transition rate of the gate current and the gate voltage flowing through the first gate 2c of the normally-on transistor 3.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a normally-off transistor which comprises a first source, a first drain, and a first gate;
   a normally-on transistor which comprises a second source connected electrically to the first drain, a second drain, and a second gate;
   a gate drive circuit which drives the first gate and the second gate;
   a first resistor which is connected between an output node of the gate drive circuit and the first gate;
   a second resistor and a first capacitor which are connected in series between the output node and the second gate;
   a first rectifier element which comprises a first anode connected electrically to the second gate and a first cathode connected electrically to the first source or the first drain;
   a second rectifier element which comprises a second anode connected electrically to the gate drive circuit and a second cathode connected electrically to the first gate;
   a first inductor which is connected between the first drain and the second source;
   a second inductor which is connected electrically between a reference potential node of the gate drive circuit and the first source; and
   a second capacitor and a third inductor which are connected in series between the first source and the second source.

2. The semiconductor device according to claim 1, wherein
   the second capacitor is connected between one end part of the third inductor and the second source, and
   the second inductor is connected between another end part of the third inductor and the reference potential node.

3. The semiconductor device according to claim 2, further comprising:
   a fourth inductor which is connected between the second capacitor and the one end part of the third inductor, wherein
   the second capacitor, the fourth inductor, and the third inductor are connected in series between the first source and the second source.

4. The semiconductor device according to claim 1, further comprising:
   a main circuit current path through which a current flows in an order of the second source, the first inductor, the first drain, the first source, and the second inductor;
   a first current path through which a current flows in an order of the second resistor, the first capacitor, the first inductor, the first drain, the first source, and the second inductor; and
   a second current path through which a current flows in an order of the second source, the second capacitor, the third inductor, and the second inductor.

5. The semiconductor device according to claim 1, further comprising:
   a first drain region, a second drain region, a source region, and a Kelvin source region which are arranged separately in places different from each other on a semiconductor substrate, wherein
   the first drain is connected electrically to the first drain region,
   the first inductor is a parasitic inductor of a first wiring which electrically connects the first drain region and the second source,
   the second inductor is a parasitic inductor of a second wiring which electrically connects the first source and the Kelvin source region, and
   the third inductor is a parasitic inductor of a third wiring which electrically connects the first source and the source region.

6. The semiconductor device according to claim 5, further comprising:
   a fourth wiring which electrically connects the first cathode and the first drain region.

7. The semiconductor device according to claim 5, further comprising:
   a fifth wiring which electrically connects the first cathode and the Kelvin source region.

8. A semiconductor package comprising:
   a normally-off transistor which comprises a first source, a first drain, and a first gate;
   a normally-on transistor which comprises a second source connected electrically to the first drain, a second drain, and a second gate;
   a first resistor which is connected between an output node of a gate drive circuit which drives the first gate and the second gate, and the first gate;
   a second resistor and a first capacitor which are connected in series between the output node and the second gate;
   a first capacitor which is connected electrically between the output node of the gate drive circuit and the second gate;
   a first rectifier element which comprises a first anode connected electrically to the second gate and a first cathode connected electrically to the first source or the first drain;
   a second rectifier element which comprises a second anode connected electrically to the gate drive circuit and a second cathode connected electrically to the first gate;
   a first inductor which is connected between the first drain and the second source;

a second inductor which is connected electrically between a reference potential node of the gate drive circuit and the first source; and a second capacitor and a third inductor which are connected in series between the first source and the second source.

9. The semiconductor package according to claim 8, wherein the second capacitor is connected between one end part of the third inductor and the second source, and the second inductor is connected between another end part of the third inductor and the reference potential node.

10. The semiconductor package according to claim 9, further comprising:

a fourth inductor which is connected between the second capacitor and the one end part of the third inductor, wherein the second capacitor, the fourth inductor, and the third inductor are connected in series between the first source and the second source.

11. The semiconductor package according to claim 8, further comprising:

a main circuit current path through which a current flows in an order of the second source, the first inductor, the first drain, the first source, and the second inductor;

a first current path through which a current flows in an order of the second resistor, the first capacitor, the first inductor, the first drain, the first source, and the second inductor; and a second current path through which a current flows in an order of the second source, the second capacitor, the third inductor, and the second inductor.

12. The semiconductor package according to claim 8, further comprising:

a first drain region, a second drain region, a source region, and a Kelvin source region which are arranged separately in places different from each other on a semiconductor substrate, wherein the first drain is connected electrically to the first drain region, the first inductor is a parasitic inductor of a first wiring which electrically connects the first drain region and the second source, the second inductor is a parasitic inductor of a second wiring which electrically connects the first source and the Kelvin source region, and the third inductor is a parasitic inductor of a third wiring which electrically connects the first source and the source region.

13. The semiconductor package according to claim 12, further comprising:

a fourth wiring which electrically connects the first cathode and the first drain region.

14. The semiconductor package according to claim 12, further comprising:

a fifth wiring which electrically connects the first cathode and the Kelvin source region.

\* \* \* \* \*